(12) United States Patent
Lai et al.

(10) Patent No.: US 7,925,999 B2
(45) Date of Patent: Apr. 12, 2011

(54) METHOD OF MODIFYING VIAS CONNECTION OF PRINTED CIRCUIT BOARDS

(75) Inventors: Ying-Tso Lai, Taipei Hsien (TW); Chien-Hung Liu, Taipei Hsien (TW); Shou-Kuo Hsu, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 345 days.

(21) Appl. No.: 12/140,325

(22) Filed: Jun. 17, 2008

(65) Prior Publication Data

US 2009/0259984 A1 Oct. 15, 2009

(30) Foreign Application Priority Data

Apr. 11, 2008 (CN) .......................... 2008 1 0301061

(51) Int. Cl.
*G06F 17/50* (2006.01)
(52) U.S. Cl. ......... 716/15; 716/1; 716/2; 716/3; 716/12; 716/13; 716/14; 703/13; 703/14
(58) Field of Classification Search .................. 716/1–3, 716/12–15; 703/13–14
See application file for complete search history.

(56) References Cited

U.S. PATENT DOCUMENTS

| | | | | |
|---|---|---|---|---|
| 6,137,064 A | * | 10/2000 | Kiani et al. | 174/266 |
| 2009/0199149 A1 | * | 8/2009 | Kwong | 716/15 |

OTHER PUBLICATIONS

Hsu et al., Placement of Shorting Vias for Power Integrity in Multi-Layer Structures, 2008, IEEE, pp. 91-94.*

* cited by examiner

*Primary Examiner* — Nghia M Doan
(74) *Attorney, Agent, or Firm* — D. Austin Bonderer

(57) ABSTRACT

A design method of printed circuit boards includes the following steps. First, simulate a printed circuit board including power layers, and vias connected to all the power layers. Then, change connections of the vias that tend to draw too much current to be connected to fewer power layers, than the vias that tend to draw less current. Repeat adjusting connections of the vias until all vias draw a similar amount of current such that no via draws more current than an upper limit the vias are designed for. Finally, according to the results, design/fabricate a PCB with vias respectively insulated, as needed, from the power layers that do not need to be connected to the vias.

4 Claims, 5 Drawing Sheets

| through via | P1 | P2 | P3 | P4 | P5 | P6 | P7 | P8 |
|---|---|---|---|---|---|---|---|---|
| current | 3.266A | 1.777A | 1.000A | 1.040A | 3.268A | 1.394A | 0.895A | 1.170A |
| through via | P9 | P10 | P11 | P12 | P13 | P14 | P15 | P16 |
| current | 4.201A | 2.080A | 1.531A | 2.000A | 7.942A | 5.121A | 4.070A | 4.478A |

FIG. 2

| through via | P1 | P2 | P3 | P4 | P5 | P6 | P7 | P8 |
|---|---|---|---|---|---|---|---|---|
| the number of power layer(s) | 3 | 4 | 5 | 6 | 3 | 4 | 5 | 5 |
| current | 3.331A | 3.109A | 1.931A | 1.882A | 2.243A | 1.277A | 2.067A | 2.203A |
| through via | P9 | P10 | P11 | P12 | P13 | P14 | P15 | P16 |
| the number of power layer(s) | 2 | 3 | 4 | 4 | 1 | 2 | 2 | 2 |
| current | 2.803A | 1.588A | 3.008A | 3.269A | 3.416A | 2.166A | 1.641A | 1.985A |

FIG. 3

| through via | P1 | P2 | P3 | P4 | P5 | P6 | P7 | P8 |
|---|---|---|---|---|---|---|---|---|
| the number of power layer(s) | 3 | 4 | 5 | 6 | 3 | 4 | 5 | 5 |
| current | 3.320A | 3.046A | 1.811A | 1.776A | 2.221A | 1.237A | 1.946A | 2.075A |
| through via | P9 | P10 | P11 | P12 | P13 | P14 | P15 | P16 |
| the number of power layer(s) | 2 | 3 | 4 | 4 | 1 | 2 | 3 | 3 |
| current | 2.808A | 1.576A | 2.869A | 3.126A | 3.405A | 2.123A | 2.226A | 2.585A |

FIG. 4

METHOD OF MODIFYING VIAS CONNECTION OF PRINTED CIRCUIT BOARDS

BACKGROUND

1. Field of the Invention

The present invention relates to a design method of printed circuit boards (PCBs) for averaging currents flowing through vias.

2. Description of Related Art

As connection plates of electronic elements, PCBs play an important role in the electronics industry. With the development of electronic products, PCBs have become dense, highly integrated, multilayer structures. Each power layer of multilayer PCBs provide current for vias connected to it. The currents of the vias have an upper value limit. For the multilayer PCBs, the current distribution of each power layer is uneven, and the currents of some vias tend to exceed the limit. When the currents exceed the limit, the plated wall of the via may melt, and the via will not work properly.

What is needed, therefore, is a design method of PCBs which can average currents flowing through vias.

SUMMARY

An exemplary design method of printed circuit boards (PCBs) includes the following steps. First, simulate a PCB including power layers, and vias connected to all the power layers. Then, change connections of the vias that tend to draw too much current to be connected to fewer power layers, than the vias that tend to draw less current. Repeat adjusting the connection of vias until all vias draw a similar amount of current such that no via draws more current than an upper limit the vias are designed for. Finally, according to the results, design/fabricate a PCB with vias respectively insulated, as needed, from the power layers that do not need to be connected to the vias.

Other advantages and novel features of the present invention will become more apparent from the following detailed description of an embodiment when taken in conjunction with the accompanying drawings, in which:

BRIEF DESCRIPTION OF THE DRAWINGS

FIG. 2 is a table of the currents flowing through the sixteen vias when all vias are connected to all layers in FIG. 1;

FIG. 3 is a table of the number of power layers connected to the sixteen vias, and the currents flowing through the sixteen vias after repeatedly adjusting connections of the vias; and FIG. 4 is another table of the number of power layers connected to the sixteen vias, and the currents flowing through the sixteen vias after repeatedly adjusting connections of the vias.

DETAILED DESCRIPTION

Figure 1:
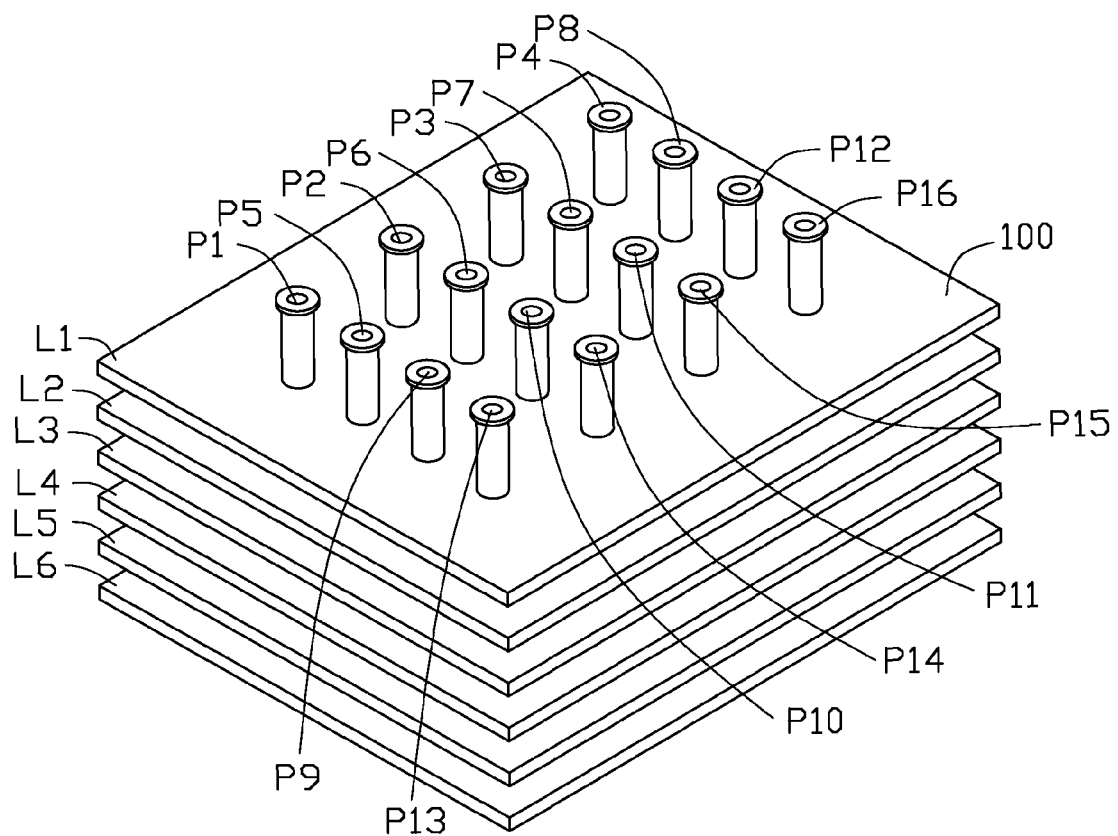
FIG. 1 is a schematic view of a simulated multilayer printed circuit board including six layers and sixteen vias.

A design method of printed circuit boards (PCBs) in accordance with an embodiment of the present invention includes the following steps. First, simulate a PCB including power layers, and vias connected to the power layers using a simulation software located on a computer readable storage device. In this embodiment, there are six power layers L1-L6, and sixteen vias P1-P16, as illustrated in FIG. 1. Then, measure the currents of the vias P1-P16 using the simulation software, a table of measured currents is shown in FIG. 2 as an example. It can be seen that the currents of the sixteen vias P1-P16 are extremely uneven. The currents of the vias P9, P13, P14, P15, and P16 are greater than those of the vias P3, P4, and P7. The maximum and minimum currents are 7.942 amperes (A) and 0.895 A respectively.

Then, to narrow the range of the maximum and minimum currents, the vias that tend to draw too much current are reconfigured to be connected to fewer power layers, than the vias that tend to draw less current, the connections of the vias are adjusted until all vias draw a similar amount of current such that no via draws more current than an upper limit the vias are designed for. In the embodiment, the upper limit is 3.5 A. When differences between current drawn of the sixteen vias P1-P16 are reduced, and no via draws more current than 3.5 A, the numbers of the power layers connected to the sixteen vias are obtained, as shown in FIG. 3. The maximum and the minimum currents now are 3.1416 A and 1.882 A respectively. The currents of the sixteen vias P1-P16 are now in a narrow range than those in FIG. 1. It can be seen that there is a complex relationship between the power layers and the vias. For example, in this embodiment, even though the connections of the via P4 were not changed, the current drawn by P4 was. In this case the current drawn was raised to 1.882 A.

Figure 5:
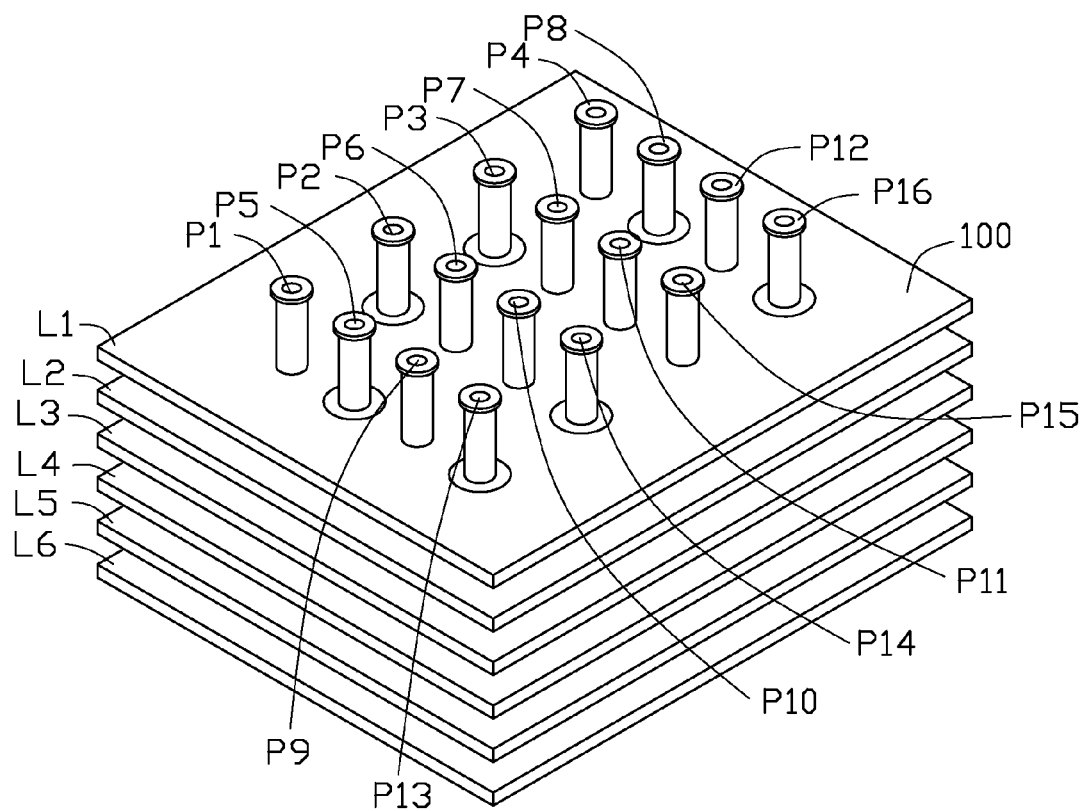
FIG. 5 is a schematic view of a simulated multilayer printed circuit board having anti-pads in accordance with an embodiment of the present disclosure.

In use, anti-pads are arranged between the vias and the power layers that do not need to be connected to the vias. For example, as illustrated in FIG. 5, three power layers do not need to be connected to the via P1. Therefore, three anti-pads are applied to any three of the six power layers L1-L6 to insulate the via P1 from three power layers.

FIG. 4 shows the results of another simulation. As can be seen different results are possible each time so long as differences between the currents flowing through the vias P1-P16 are reduced, so the number of the power layers connected to the vias is not exclusive.

The foregoing description of the exemplary embodiments of the invention has been presented only for the purposes of illustration and description and is not intended to be exhaustive or to limit the invention to the precise forms disclosed. Many modifications and variations are possible in light of the above everything. The embodiments were chosen and described in order to explain the principles of the invention and their practical application so as to enable others skilled in the art to utilize the invention and various embodiments and with various modifications as are suited to the particular use contemplated. Alternately embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A design method for a printed circuit board (PCB), the method comprising of:

running a first simulation of a PCB comprising a plurality of power layers, and a plurality of vias connected to the power layers;

changing connections of the vias that tend to draw too much current to be connected to fewer power layers, than the vias that tend to draw less current;

running subsequent simulations;

repeatedly adjusting connections of the vias until all vias draw a current that falls within a predetermined range so that no via draws more current than an upper limit the vias are designed for, and obtaining the proper number of the power layers to be electrically connected to each of the vias; and according to the proper number of the power layers electrically connected to each of the vias, design/fabricate the PCB with vias free from contact with the power layers that have been determined should not connected to the individual vias.

2. The design method as claimed in claim 1, wherein in the first simulation step, the plurality of vias are electrically connected to all of the power layers.

3. A design method with a PCB which narrows the range of the maximum and minimum currents flowing through vias on the PCB, the method comprising of:

running a first simulation of a PCB comprising a plurality of power layers, and a plurality of vias electrically connected to the power layers;

changing connections of the vias that tend to draw too much current to be connected to fewer power layers, than the vias that tend to draw less current;

running subsequent simulations; and repeatedly adjusting connections of the vias until all vias draw a current that is within a predetermined range so that no via draws more current than an upper limit the vias are designed for, and obtaining the proper number of the power layers to be electrically connected to each of the vias, wherein the proper number of the power layers electrically connected to each of the vias is obtained in a simulation software located on a computer readable storage device.

4. The design method as claimed in claim 3, wherein the proper number of the power layers electrically connected to each of the vias is obtained in a simulation software located on a computer readable medium.

* * * * *